US006942265B1

(12) United States Patent
Boyd et al.

(10) Patent No.: US 6,942,265 B1
(45) Date of Patent: Sep. 13, 2005

(54) APPARATUS COMPRISING A FLEXIBLE VACUUM SEAL PAD STRUCTURE CAPABLE OF RETAINING NON-PLANAR SUBSTRATES THERETO

(75) Inventors: Trace Boyd, San Jose, CA (US); Eric Johanson, Union City, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 182 days.

(21) Appl. No.: 10/278,593

(22) Filed: Oct. 23, 2002

(51) Int. Cl.[7] .............................................. B25J 15/06
(52) U.S. Cl. ........................ 294/64.1; 414/941; 901/40
(58) Field of Search ............................. 294/64.1, 64.2, 294/64.3, 65; 901/40; 414/637, 727, 752.1, 414/941

(56) References Cited

U.S. PATENT DOCUMENTS

| 3,720,433 | A | * | 3/1973 | Rosfelder .................. 294/64.1 |
| 4,286,815 | A | * | 9/1981 | Clark .......................... 294/1.2 |
| 4,620,738 | A | * | 11/1986 | Schwartz et al. ........... 294/64.1 |
| 5,226,636 | A | * | 7/1993 | Nenadic et al. ................ 269/21 |
| 5,879,040 | A | * | 3/1999 | Nagai et al. .................... 294/65 |
| 5,937,993 | A | * | 8/1999 | Sheets et al. ............. 198/345.1 |
| 6,062,241 | A | * | 5/2000 | Tateyama et al. ........... 134/137 |

* cited by examiner

Primary Examiner—Dean J. Kramer
(74) Attorney, Agent, or Firm—John P. Taylor

(57) ABSTRACT

A flexible vacuum seal pad structure capable of, for example, sealingly securing a bowed substrate to a finger apparatus or "endeffector" used to robotically engage and/or move the substrate from one processing station to another, or capable of securing a wafer to a base member or susceptor during processing of the wafer, i.e., functioning as a chuck. The flexible vacuum seal pad structure of the invention comprises a hollow central post or shank which serves as a mounting or retention mechanism, a flexible arch-like member connected at one end to the central post, and a peripheral ring structure connected to the opposite end of the arch member. The peripheral ring structure contacts and forms a seal with the underside of the wafer, while the arch member provides the flexibility to permit the ring structure to make or form a sealing contact to a bowed wafer, and the central post provides a mechanism through which the flexible vacuum seal pad structure may be secured to the base or finger.

19 Claims, 4 Drawing Sheets

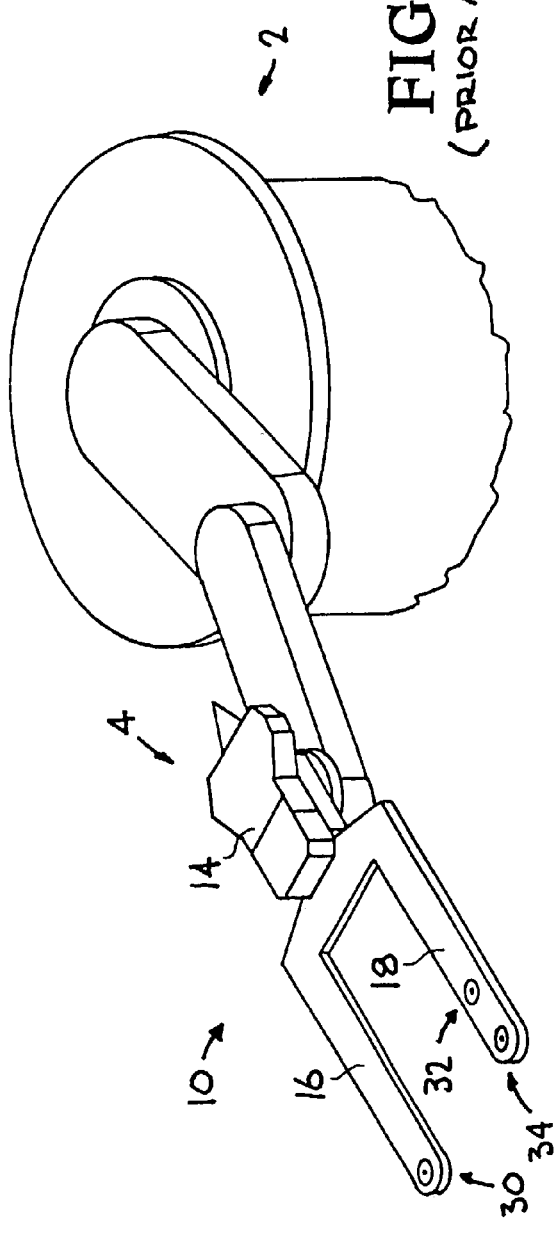
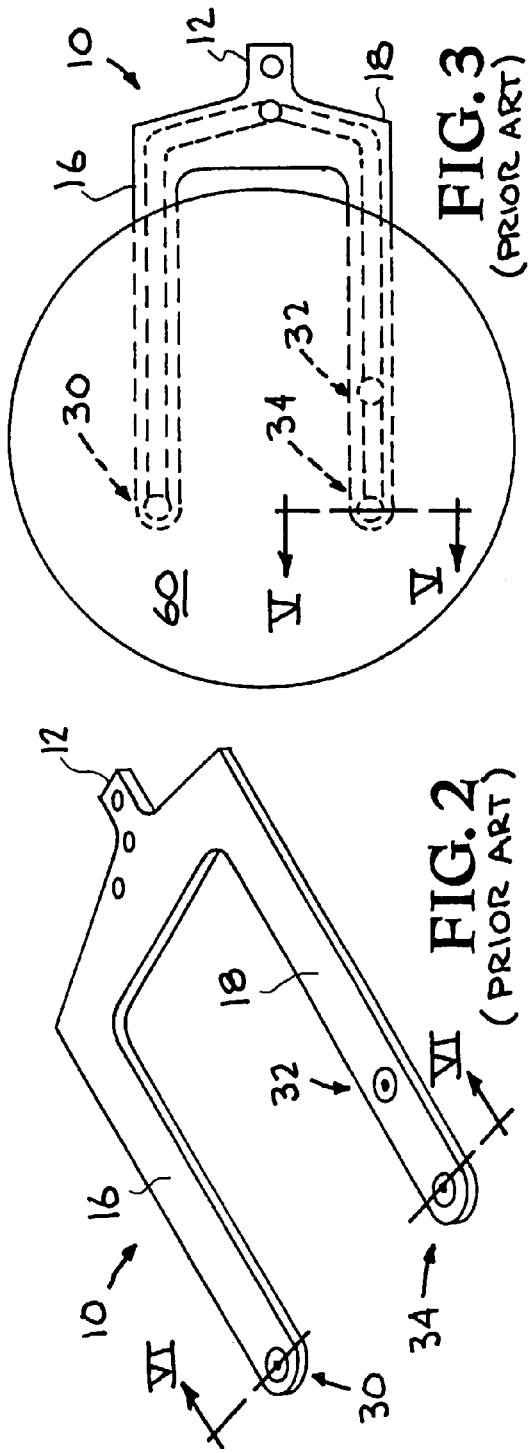

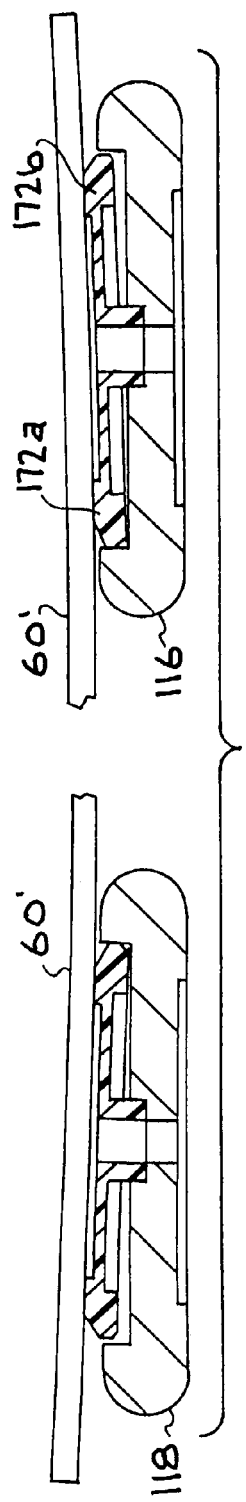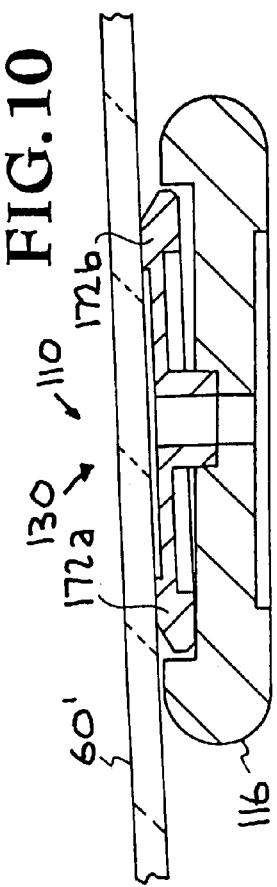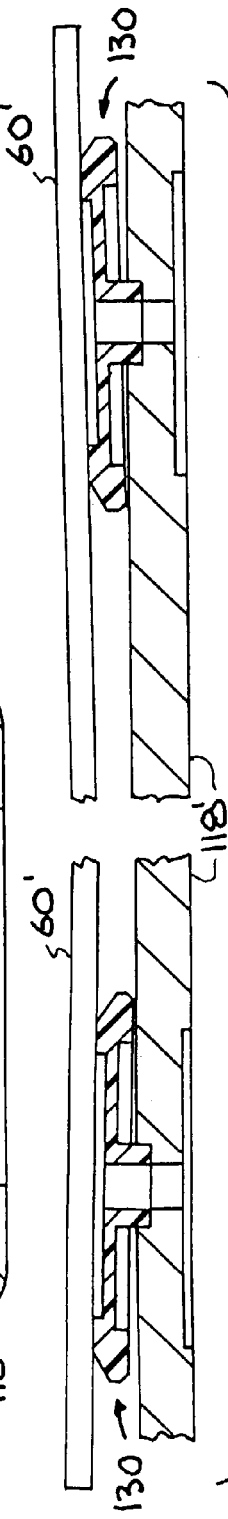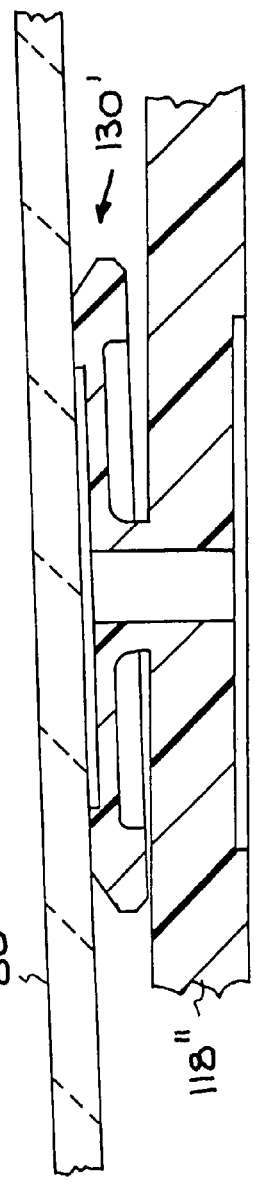
FIG. 10
FIG. 11
FIG. 12
FIG. 13 ized for the purpose of this description as pos

APPARATUS COMPRISING A FLEXIBLE VACUUM SEAL PAD STRUCTURE CAPABLE OF RETAINING NON-PLANAR SUBSTRATES THERETO

BACKGROUND OF THE INVENTION

1. Field of the Invention

This invention relates to an apparatus capable of engaging and retaining bowed substrates thereto. More particularly, this invention relates to an improved apparatus, comprising a flexible vacuum seal pad structure capable of enhanced retention of non-planar substrates thereto.

2. Description of the Related Art

Movement of substrates such as silicon semiconductor wafers from one process chamber to another chamber is commonly done with remote equipment such as, for example, robotic apparatus with minimal manual handling of the substrate. This requires secure retention of the substrate (usually the backside of the substrate) to the apparatus carrying out the movement of the substrate. Referring to prior art FIGS. 1–6, FIG. 1 shows a portion of a typical prior art robotic apparatus generally indicated by arrow at 2 and having a robotic arm, generally indicated at arrow 4, attached thereto. A flat finger apparatus or endeffector, generally indicated in the prior art embodiment of FIGS. 1–3 at arrow 10, is generally U-shaped, with a short stub arm 12, at the bottom of the U, which is attached to robotic arm 4 at 14, as seen in prior art FIG. 1.

The prior art generally U-shaped finger apparatus 10 shown in FIGS. 1–3 is typically provided with two flat fingers 16 and 18, which comprise the side portions of the U-shape of finger apparatus 10. Fingers 16 and 18 contact the underside of the substrate being transported (in the prior art apparatus of FIGS. 1–3) through three identical vacuum pad mechanisms mounted thereon, as generally indicated by arrows 30, 32, and 34 in FIGS. 1–3.

FIG. 4 shows a variation of the prior art wherein a single finger apparatus 10' is shown which is capable of being attached to an arm of a robotic apparatus (not shown). Since only a single finger apparatus is used in this prior art embodiment, only two vacuum pad mechanisms 32 and 34 are shown, FIG. 5 shows, in more detail, one version of a typical prior art vacuum pad mechanism 34, representative of the construction of identical vacuum pad mechanisms 30 and 32 as well. A large bore 40 is shown formed partially through finger 18 of finger apparatus 10 perpendicular to the surface of finger 18. A smaller bore 44 is then formed completely through the remainder of finger 18 to intersect a covered groove 46 formed in the opposite surface of finger 18, to provide communication between vacuum pad mechanism 34 and an external vacuum pump (not shown) which forms no part of this invention. Received in large bore 40 is a circular seal 50 having an OD slightly larger than the diameter of large bore 40 to thereby form a seal between seal 50 and the sidewall of large bore 40. All of the bottom surface of seal 50 is conventionally secured to the bottom wall of large bore 40 by an adhesive.

Seal 50 is provided with a central bore 54 concentric with small bore 44 in finger 18 of finger apparatus 10, and having the same diameter as central bore 44 as well. Seal 50 is further provided with an upstanding peripheral lip 56 on its upper surface 52, thereby defining a vacuum plenum 58 between lip 56 and upper surface 52 of seal 50 and the undersurface of a substrate as shown in FIG. 5. When a flat substrate 60 is engaged by vacuum pad mechanisms 30, 32, and 34, the vacuum plenum formed by seal 50 of each vacuum pad structure 30, 32, and 34 draws substrate 60 snugly against vacuum pad structures 30–34 while robot arm 4 and finger apparatus endeffector 10 thereon move substrate 60 to its desired destination.

In a perfect world where substrate 60 would always be perfectly flat before, during, and after processing, the problem which this invention seeks to solve would not exist, at least not to the extent of the problem described above. However, as shown in exaggerated form in prior art FIG. 6, warped or bowed substrate 60', cannot enter into the previously described sealing relationship with vacuum pad mechanism 30, 32, and 34, since the rigid prior art structure has little if any flexibility to permit the vacuum pad mechanism 30, 32, and 34 to compensate for the bowed condition of substrate 60'. Since a vacuum seal is not established between vacuum pad mechanisms 30, 32, and 34 and warped or bowed substrate 60', substrate 60' is not secured to finger apparatus 10. This, in turn, means that substrate 60' is free to slide on the upper portions of fingers 16 and 18 of finger apparatus 10, which is an unacceptable condition.

FIG. 7 shows a prior art modification of the above described vacuum pad mechanisms 30, 32, and 34 wherein a barrel-shaped opening 20 is formed in a base member or finger 19. A seal structure 22 comprising a flexible material having barrel-shaped sidewalls thereon slightly larger than the barrel-shaped openings 20 in finger 19. Seal structure 22 is inserted into barrel-shaped opening 20 to provide a fit tight enough to be gas-tight, yet not so tight as to prevent or inhibit seal structure 22 from tilting in its respective barrel shaped opening formed in finger 19 to thereby provide some degree of adjustment for non-planar wafers.

While the foregoing may constitute an improvement over the earlier described prior art structures and practice previously described, it still would be desirable to provide an apparatus comprising one or more flexible vacuum seal pad structures capable of sealingly engaging even a bowed substrate to permit movement of the substrate from, for example, one processing station to another while maintaining securement of the bowed substrate to the finger apparatus.

SUMMARY OF THE INVENTION

The invention comprises a flexible vacuum seal pad structure capable of, for example, sealingly securing a bowed substrate to a finger apparatus or "endeffector" used to robotically engage and/or move the substrate from one processing station to another, or capable of securing a wafer to a base member or susceptor during processing of the wafer, i.e., functioning as a chuck. The flexible vacuum seal pad structure of the invention comprises a hollow central post or shank which serves as a mounting or retention mechanism, a flexible arch-like member connected at one end to the central post, and a peripheral ring structure connected to the opposite end of the arch member. The peripheral ring structure contacts and forms a seal with the underside of the wafer, while the arch member provides the flexibility to permit the ring structure to make or form a sealing contact to a bowed wafer, and the central post provides a means through which the flexible vacuum seal pad structure may be secured to the base or finger.

One or more of such flexible vacuum seal pad structures are mounted on/in a base member such as, for example, a susceptor in a wafer processing chamber, or the upper surface of one or more flat fingers of the previously described finger apparatus facing the underside of a substrate. When the flexible vacuum seal pad structure is to be recessed into the underlying base, a large bore may be formed in the upper surface of the base to receive each of the flexible vacuum seal pad structures.

When the base comprises the previously described flat fingers, it is particularly desirable to provide such a recessed large bore in the upper surface of the flat finger to receive the flexible vacuum seal pad structure, due to height considerations when the finger or fingers are to be inserted between stacked wafers in a cassette or the like. When such a large bore is provided in the base, its diameter should be sufficient to slidably receive the peripheral ring or depending skirt of the flexible vacuum seal pad structure.

The flexible vacuum seal pad structure is rigidly secured to the finger or base by the hollow central post or shank of the flexible vacuum seal pad structure. This central post or shank is received in a second bore in the base or finger. This second bore is smaller in diameter than the large bore in the base or finger but concentrically positioned in the large bore and, in at least the case where the base comprises a finger, extends completely through the finger. When the flexible vacuum seal pad structure encounters a bowed substrate, the peripheral ring portion of the flexible vacuum seal pad structure is capable of peripheral movement generally independent of the finger to engage the bowed shape of the substrate to thereby establish a vacuum seal between the underside of the bowed substrate and the flexible vacuum seal pad structure.

BRIEF DESCRIPTION OF THE DRAWINGS

FIG. 1 is a fragmentary isometric view of a prior art finger or "endeffector" apparatus, including a plurality of prior art vacuum pad mechanisms thereon comprising seal structures for engaging and moving substrates.

FIG. 2 is an isometric view of a portion of the prior art finger apparatus shown in FIG. 1.

FIG. 3 is an isometric view of the prior art finger apparatus of FIG. 2 partially shown in phantom lines beneath a substrate being engaged by the finger apparatus.

FIG. 10 is a fragmentary enlarged vertical cross-section view of the structure of FIG. 9 showing, in more detail, the movement of the flexible vacuum seal pad structure of the invention to conform the flexible vacuum seal pad structure of the invention to the curvature of the bowed substrate thereon.

FIG. 11 is a fragmentary enlarged vertical cross-section view of one of the flexible vacuum seal pad structure of the invention shown in FIG. 10 showing, in even greater detail, the movement of the flexible vacuum seal pad structure of the invention in contrast to the at rest position of the flexible vacuum seal pad structure of the invention shown in FIG. 8.

FIG. 12 is a vertical cross-sectional view of a structure similar to that of FIG. 9, except that the flexible vacuum seal pad structure of the invention are shown mounted in a fixed base such as, for example, a susceptor to retain a bowed wafer during processing of the wafer in a processing chamber.

FIG. 13 is a vertical cross-sectional view of another embodiment of the invention wherein the flexible vacuum seal pad structure and the base are all formed from the same material.

DETAILED DESCRIPTION OF THE INVENTION

Figure 4:
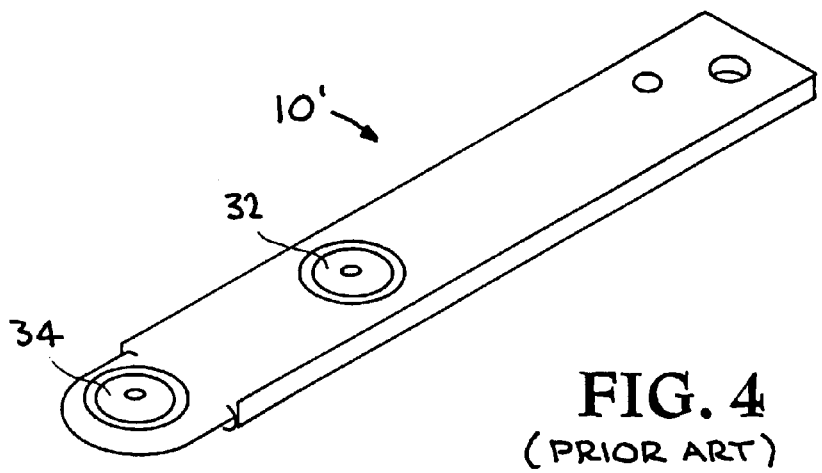
FIG. 4 is an isometric view comprising another embodiment of a prior art finger or base support member.
Figure 5:
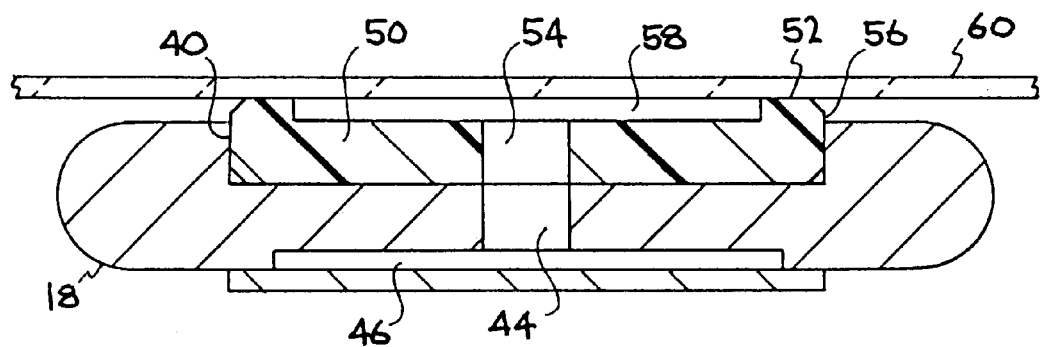
FIG. 5 is a cross-sectional view of one of the prior art vacuum pad mechanisms of the prior art finger apparatus of FIG. 3 taken along lines V—V.
Figure 6:
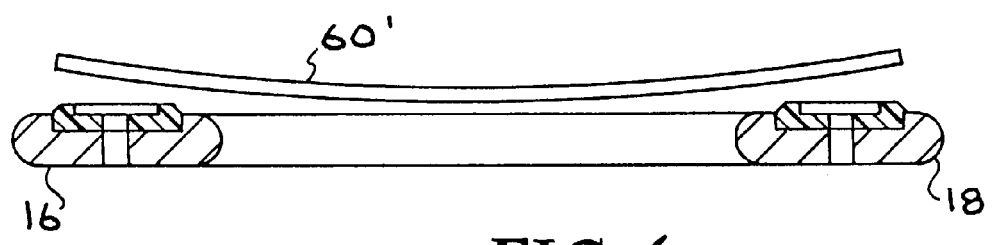
FIG. 6 is a vertical cross-sectional view of a portion of the prior art finger apparatus of FIG. 2, taken along lines VI—VI, showing a bowed substrate thereon above two of the prior art vacuum pad mechanisms.
Figure 7:
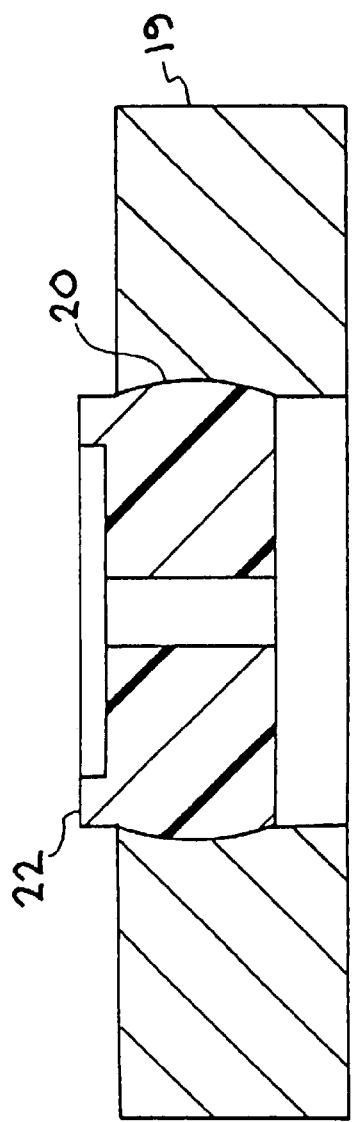
FIG. 7 is a vertical cross-sectional view of another embodiment of the seal structure of the prior art.

The invention comprises a flexible vacuum seal pad structure capable of, for example, sealingly securing a bowed substrate to a finger apparatus or "endeffector" used to robotically engage and/or move the substrate from one processing station to another. The flexible vacuum seal pad structure of the invention is also capable of securing a wafer to a base member or susceptor during processing of the wafer, i.e., functioning as a chuck. The flexible vacuum seal pad structure of the invention comprises a hollow central post or shank which serves as a mounting or retention mechanism, a flexible arch-like member connected at one end to the central post, and a peripheral ring structure connected to the opposite end of the arch member. The peripheral ring structure contacts and forms a seal with the underside of the wafer, while the arch member provides the flexibility to permit the ring structure to make or form a sealing contact to a bowed wafer, and the central post provides a support means through which the flexible vacuum seal pad structure may be secured to the base or finger.

One or more of such flexible vacuum seal pad structures are mounted on/in a base member such as, for example, a susceptor in a wafer processing chamber, or the upper surface of one or more flat fingers of the previously described finger apparatus facing the underside of a substrate. When the flexible vacuum seal pad structure is to be recessed into the underlying base, a large bore may be formed in the upper surface of the base to receive each of the flexible vacuum seal pad structures.

When the base comprises the previously described flat fingers, it is particularly desirable to provide such a recessed large bore in the upper surface of the flat finger to receive the flexible vacuum seal pad structure, due to height considerations when the finger or fingers are to be inserted between stacked wafers in a cassette or the like. When such a large bore is provided in the base, its diameter should be sufficient to slidably receive the peripheral ring or depending skirt of the flexible vacuum seal pad structure.

The flexible vacuum seal pad structure is rigidly secured to the finger or base by the hollow central post or shank of the flexible vacuum seal pad structure. This central post or shank is received in a second bore in the base or finger. This second bore is smaller in diameter than the large bore in the base or finger but concentrically positioned in the large bore. When the flexible vacuum seal pad structure encounters a bowed substrate, the peripheral ring portion of the flexible vacuum seal pad structure is capable of peripheral movement generally independent of the finger to engage the bowed shape of the substrate to thereby establish a vacuum seal between the underside of the bowed substrate and the flexible vacuum seal pad structure.

Referring now to FIGS. 8–11 the flexible vacuum seal pad structure of the invention will be described and illustrated therein in the context of its use on one or more fingers of a robotic apparatus, it being understood that this is by way of illustration and not of limitation.

Figure 8:
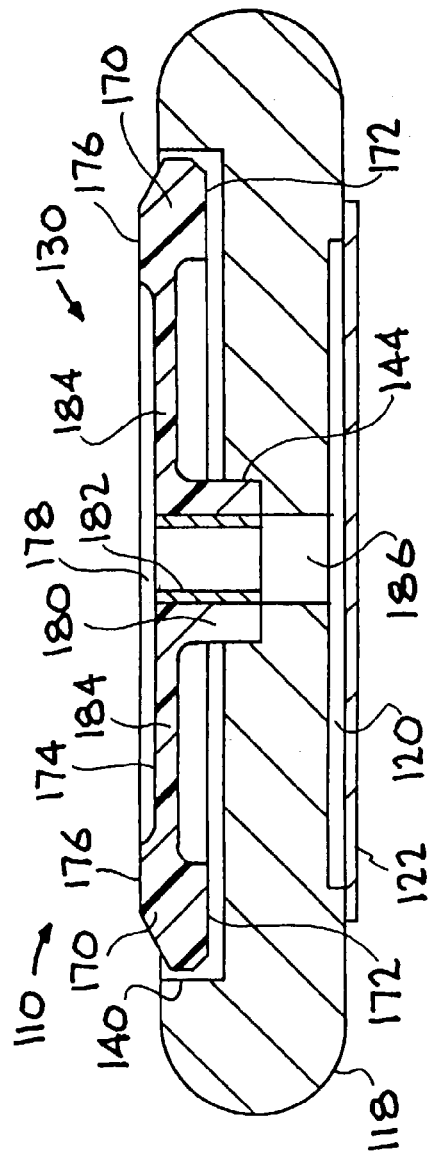
FIG. 8 is a vertical cross-sectional view of the flexible vacuum seal pad structure of the invention shown mounted on a base such as, for example, one of the fingers of the finger apparatus of FIGS. 1–3.

One of the flexible vacuum seal pad structures of the invention is shown in FIG. 8, as indicated by arrow 130 mounted in/on the upper surface of one of the flat fingers 118 of finger apparatus 110. Finger 118 has a large circular bore 140 formed in the upper surface therein which extends down into finger 118 to a depth of about one half of the thickness of flat finger 118.

Finger 118 is further provided with a smaller circular bore 144, and a yet smaller bore 186, both formed concentric with large bore 140. While small bore 144 and small bore 186 are both smaller in diameter than large bore 140, small bore 144, unlike large bore 140, extends further into finger 118, and small bore 186 extends completely through flat finger 118 to the under side of flat finger 118 where it intersects with a flat groove 120 in the surface of the underside of flat finger 118.

Flat groove 120 has a cover 122 sealingly fitted thereon which enables groove 120 to serve as a vacuum conduit to an external source of vacuum (not shown) such as a vacuum pump. Groove 120 and its connection to an external source of vacuum forms no part of the present invention, and is only illustrated and generally described for clarity in how the flexible vacuum seal pad structure of the invention operates.

The flexible vacuum seal pad structure of the invention is generally shown at arrow 130. Flexible vacuum seal pad structure 130 comprises a central support post or shank 180 which serves as a mounting or retention mechanism, a flexible arch-like member 184 connected at one end to central post 180, and a peripheral ring member 170 having an outer diameter (OD) slightly smaller than the inner diameter (ID) of large bore 140 in finger 118. The material selected to form flexible vacuum seal pad structure 130 is preferably an elastomeric material such as, for example, an acetal, a polycarbonate, a polyimide, or a polyaryletherketone material.

Flexible vacuum seal pad structure 130 of the invention further comprises a peripheral skirt 172 which depends downwardly from the outer edge of circular member 170. Skirt 172 has a depth of about 0.01" to about 0.12" less than the depth of large bore 140 to there by permit peripheral vertical movement of ring member 170 and skirt 172 in large bore 140.

Skirt 172 has an OD approximating the ID of large bore 140 so that the outer edge of flat circular member 170 and skirt 172 fit snugly in large bore 140, but not so snugly as to prevent vertical (up and down) movement of skirt 172 and flat circular member 170 in large bore 140. Flexible vacuum seal pad structure 130 is also provided with an upwardly standing peripheral lip 176 at the outer edge of flat circular member 170 thereby defining a vacuum plenum 178 between peripheral lip 176, upper surface 174 of flexible vacuum seal pad structure 130, and the underside of substrate 60' (shown in FIGS. 9–11) to retain substrate 60' against flexible vacuum seal pad structures 130, 132, and 134 while substrate 60' is moved to its desired location.

As referred to above, flexible vacuum seal pad structure 130 of the invention further comprises a central hollow post 180 which centrally depends downwardly from the remainder of flexible vacuum seal pad structure 130. The lower portion of central post member 180 is non-slidably received in small bore 144, either by a press fit or by the use of a bonding agent. Central post member 180 may be formed solely from the same flexible material used to form flat circular member 170 and skirt 172. In one embodiment, however, the inner surface of central post member 180 may be bonded to a metal tube 182 having an OD approximating the ID of central post 180 to impart further stiffness to post 180. The bonding agent, when used to secure flexible vacuum seal pad structure 130 to the sidewalls of bore 144, and thence to the remainder of finger 118, will depend upon the flexible material selected to be used to form flexible vacuum seal pad structure 130.

Outer peripheral ring 170 is joined to central post 180 of flexible vacuum seal pad structure 130 by an arch member 184, as shown in FIG. 8. The combination of the flexibility of material selected for flexible vacuum seal pad structure 130 and the cross-sectional area of arch member 184, as well as the outer diameter (OD) of central post 180, should be selected to be sufficient to impart sufficient movement to peripheral ring portion 170 to permit ring portion 170 to engage even a bowed substrate. However, the flexibility of arch member 184 should not be so great so as to result in distortion of peripheral ring 170, since this could result in the inability of forming a vacuum seal between substrate 60 and upper surface 176 of ring 170.

Both the minimum and maximum cross-section area of arch 184 needed for any given material selected for use in the construction of flexible vacuum seal pad structure 130 may be determined empirically by testing the resulting vacuum seal achieved using flexible vacuum seal pad structure 130. If the overall flexibility is not sufficient to permit peripheral ring member 170 sufficient movement to achieve the desired vacuum seal so as to permit ring portion 170 to engage even a bowed substrate, then the flexibility is insufficient, i.e., it should be increased. Excessive flexibility, however, could result in distortion of ring 170 which would also result in failure of the apparatus to maintain the desired vacuum on the rear surface of the substrate.

Figure 9:
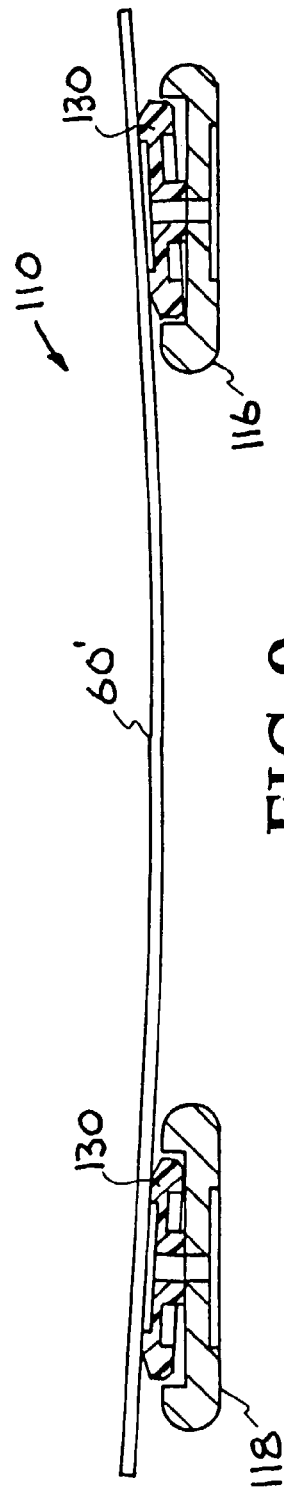
FIG. 9 is a vertical cross-sectional view similar to the view shown in FIG. 6, except that the prior art vacuum pad mechanism shown in FIG. 6, have been replaced by the flexible vacuum seal pad structure of the invention, and showing the interaction between a bowed substrate and two of the flexible vacuum seal pad structures of the invention.

When finger apparatus or endeffector 110 encounters a bowed or warped substrate 60', such as seen in FIGS. 9–11, each of the flexible vacuum seal pad structures 130 on fingers 116 and 118 adapts to the curvature of substrate 60', by vertical movement of the respective peripheral rings of flexible vacuum seal pad structure 130 either upwardly or downwardly, depending upon whether the substrate is concave or convex. Thus, as shown in FIGS. 9–11, but best seen in FIG. 11, the left portion 172a of peripheral skirt 172 of seal structure 150 travels downward, while the right portion 172b of peripheral skirt 172 of flexible vacuum seal pad structure 130 travels upward until it encounters the underside of bowed substrate 60'. This travel or controlled distortion of flexible vacuum seal pad structure 130 is made possible, in accordance with the invention, by a combination of choice of flexible material for flexible vacuum seal pad structure 130, design of the shape and dimensions of arch 184 relative to the remainder of flexible vacuum seal pad structure 130, and the securement of flexible vacuum seal pad structure 130 solely through center post 180 to finger 118.

Turning to FIG. 12, shown is a flexible vacuum seal pad structure 130 of the invention surface mounted to the upper surface of a base member 118'. Such structure might be exemplary of the use of flexible vacuum seal pad structure 130 of the invention on a susceptor in a processing chamber to secure wafer 60 to the susceptor during processing of the wafer to form an integrated circuit structure thereon.

FIG. 13 illustrates yet another embodiment of the invention wherein flexible vacuum seal pad structure 130' and base member 118" are made from the same material, i.e., in a single monolithic piece. This could be carried out by either casting the structure in a single mold or by machining a single block of the material selected.

Thus, the invention provides an apparatus comprising one or more flexible vacuum seal pad structures which will secure a bowed substrate to a base during processing of the substrate, and which also permits movement of the substrate from, for example, one processing station to another while maintaining securement of even such a bowed substrate to a base such as an finger or endeffector apparatus during such transfer of the substrate.

Having thus described the invention what is claimed is:

1. A substrate retention apparatus used to engage and/or move a substrate, including a bowed substrate, comprising a base member and two or more spaced apart flexible vacuum seal pad structures mounted thereon, each of said flexible vacuum seal pad structures comprising:
   a) a central post secured to said base member;
   b) a flexible and generally flat circular arch member centrally connected perpendicular to said central post and generally parallel to said substrate; and
   c) a peripheral ring member formed at the periphery of said flexible and generally flat circular arch member, and capable of contacting and forming a vacuum seal with said bowed substrate;
wherein said flexibility of said arch member is sufficient to permit said peripheral ring member thereon to engage a bowed substrate to achieve the desired vacuum seal, but insufficient to result in amount of distortion of said peripheral ring sufficient to prevent formation of the desired vacuum seal.

2. The substrate retention apparatus of claim 1 wherein said base member comprises a finger of a robotic apparatus.

3. The substrate retention apparatus of claim 1 wherein said base member comprises a platform to which said bowed substrate is secured by said flexible vacuum seal pad structure during processing of said bowed substrate.

4. A substrate retention apparatus of a finger apparatus with a flexible vacuum seal pad structure thereon for sealingly securing a bowed substrate to said finger apparatus used to engage and/or move the substrate comprises:
   a) a plurality of flat fingers on a finger apparatus facing the undersurface of a substrate;
   b) a flexible vacuum seal pad structure comprising:
      i) a flexible peripheral ring member;
      ii) a central post downwardly depending from a central portion of said flexible vacuum seal pad structure; and
      iii) a flexible and generally flat circular member centrally and perpendicularity connected to said central post and having said flexible peripheral ring member formed at the periphery of said flexible circular member;
   wherein said flexible peripheral member, said central post, and said flexible circular member are all formed using an elastomeric material selected from the group consisting of an acetal, a polycarbonate, a polyimide, and a polyaryletherketone:
   c) at least one large bore in the upper surface of each of said flat fingers, said large bore capable of slidably receiving therein said peripheral ring member on said flexible vacuum seal pad structure; and
   d) a second bore, smaller in diameter than said large bore but concentrically positioned in the bottom of said large bore and extending a further distance downwardly into said flat finger, said second bore capable of rigidly receiving said central post of said flexible vacuum seal pad structure;
whereby when said flexible vacuum seal pad structure encounters a bowed substrate, the peripheral ring member of said flexible vacuum seal pad structure is capable of movement independent of said finger to engage said bowed substrate to thereby establish a vacuum seal between the underside of said bowed substrate and said flexible vacuum seal pad structure.

5. A substrate retention apparatus comprising a substrate retention apparatus flexible vacuum seal pad structure used to engage and/or move a substrate, including a bowed substrate, said flexible vacuum seal pad structure comprising:
   a) a central post capable of being secured to said support base;
   b) a flexible arch member connected at one end thereof to said post; and
   c) a peripheral ring member secured to an opposite end of said flexible arch member, and capable of contacting and forming a vacuum seal with said bowed substrate; and
   d) a support base formed as a portion of said flexible vacuum seal pad structure by molding said support base, said central post, said flexible arch member, and said peripheral ring member as a monolithic structure;
said flexible arch member having a flexibility sufficient to permit movement of said peripheral ring member relative to said central post of said flexible vacuum seal pad structure to permit said peripheral ring member to form a vacuum seal with said substrate, but insufficient to permit an amount of distortion of said peripheral ring member which would inhibit formation of a vacuum seal between said peripheral ring member and said substrate, and said support base formed as a portion of said flexible vacuum seal pad structure by molding said support base, said central post, said flexible arch member, and said peripheral ring member as a monolithic structure.

6. The substrate retention apparatus of claim 5 wherein said flexible vacuum seal pad structure is formed from a flexible material selected from the group consisting of an acetyl material, a polycarbonate material, a polyimide material, and a polyaryletherketone material.

7. A substrate retention apparatus comprising a substrate retention apparatus flexible vacuum seal pad structure used to engage and/or move a substrate, including a bowed substrate, said flexible vacuum seal pad structure comprising:
   a) a central post capable of being secured to said support base;
   b) a flexible arch member connected at one end thereof to said post;
   c) a peripheral ring member secured to an opposite end of said flexible arch member, and capable of contacting and forming a vacuum seal with said bowed substrate; and
   d) a support base formed as a portion of said flexible vacuum seal pad structure by molding said support base, said central post, said flexible arch member, and said peripheral ring member as a monolithic structure;
said flexible arch member having a flexibility sufficient to permit movement of said peripheral ring member relative to said central post of said flexible vacuum seal pad structure to permit said peripheral ring member to form a vacuum seal with said substrate, but insufficient to permit an amount of distortion of said peripheral ring member which would inhibit formation of a vacuum seal between said peripheral ring member and said substrate, and said support base is formed as a portion of said flexible vacuum seal pad structure by machining said support base, said central post, said flexible arch member, and said peripheral ring member from a single block of material as a monolithic structure.

8. The substrate retention apparatus of claim 7 wherein a peripheral lip formed on the upper surface of said flexible vacuum seal pad structure is capable of making contact with said underside of said substrate even when said substrate is non-planar, due to the vertical movement of the peripheral portion of said flexible vacuum seal pad structure due to the central attachment of said flexible vacuum seal pad structure to said substrate retention apparatus.

9. The substrate retention apparatus of claim 7 wherein said flexible vacuum seal pad structure is formed from a flexible material selected from the group consisting of an acetyl material, a polycarbonate material, a polyimide material, and a polyaryletherketone material.

10. A substrate retention apparatus used to engage and/or move a substrate, including a bowed substrate, comprising one or more fingers, each of said one or more fingers having mounted thereon one or more flexible vacuum seal pad structures, each of said flexible vacuum seal pad structures comprising:
   a) a central post secured to one of said one or more fingers by forming said central post and said finger as a single piece;
   b) a flexible arch member connected at one end thereof to said post; and
   c) a peripheral ring member secured to an opposite end of said flexible arch member, and capable of contacting and forming a vacuum seal with said bowed substrate.

11. A substrate retention apparatus used to engage and/or move a substrate, including a bowed substrate, comprising one or more fingers, each of said one or more fingers having mounted thereon one or more flexible vacuum seal pad structures, each of said flexible vacuum seal pad structures comprising:
   a) a base member;
   b) a central post secured to said base by forming said central post and said finger as a single piece;
   c) a flexible arch member connected at one end thereof to said post; and
   d) a peripheral ring member secured to an opposite end of said flexible arch member, and capable of contacting said substrate and forming a vacuum seal with said bowed substrate.

12. The substrate retention apparatus of claim 11 wherein said flexible arch member has a flexibility sufficient to permit movement of said peripheral ring member relative to said central post of said flexible vacuum seal pad structure to permit said peripheral ring member to form a vacuum seal with said substrate, but insufficient to permit an amount of distortion of said peripheral ring member which would inhibit formation of a vacuum seal between said peripheral ring member and said substrate.

13. The flexible vacuum seal pad structure of claim 12 wherein said flexibility of said flexible arch member is controlled at least in part by the choice of material and the cross-sectional area of said flexible arch member.

14. A substrate retention apparatus used to engage and/or move a substrate, including a bowed substrate, comprising one or more fingers, each of said one or more fingers having mounted thereon two or more flexible vacuum seal pad structures, each of said flexible vacuum seal pad structures comprising:
   a) a central post secured to one of said one or more fingers;
   b) a flexible and generally flat circular member centrally and perpendicularity formed monolithically with said central post; and
   c) a peripheral ring member secured to the periphery of said flexible circular member, and capable of contacting and forming a vacuum seal with said bowed substrate.

15. The substrate retention apparatus of claim 14 wherein said one or more fingers each has three or more of said flexible vacuum seal pad structures mounted thereon.

16. The substrate retention apparatus of claim 15 wherein said central post, said flexible flat circular member, and said peripheral ring member are secured together by forming said central post, said flexible flat circular member, and said peripheral ring member as a monolithic structure.

17. A substrate retention apparatus used to engage and/or move a substrate, including a bowed substrate, comprising one or more fingers, each of said one or more fingers having mounted thereon two or more flexible vacuum seal pad structures, each of said flexible vacuum seal pad structures comprising:
   a) a base member;
   b) a central post secured to said base member;
   c) a flexible flat circular member centrally connected to said central post; and
   d) a peripheral ring member formed monolithically at the periphery of said flexible flat circular member, and capable of contacting said substrate and forming a vacuum seal with said bowed substrate.

18. The substrate retention apparatus of claim 17 wherein said one or more fingers each have three or more of said flexible vacuum seal pad structures mounted thereon.

19. The substrate retention apparatus of claim 17 wherein flexible vacuum seal pad structures comprising said central post, said flexible flat circular member, and said peripheral ring member are secured together by forming said central post, said flexible flat circular member, and said peripheral ring member as a monolithic structure.

* * * * *